Figure 1:
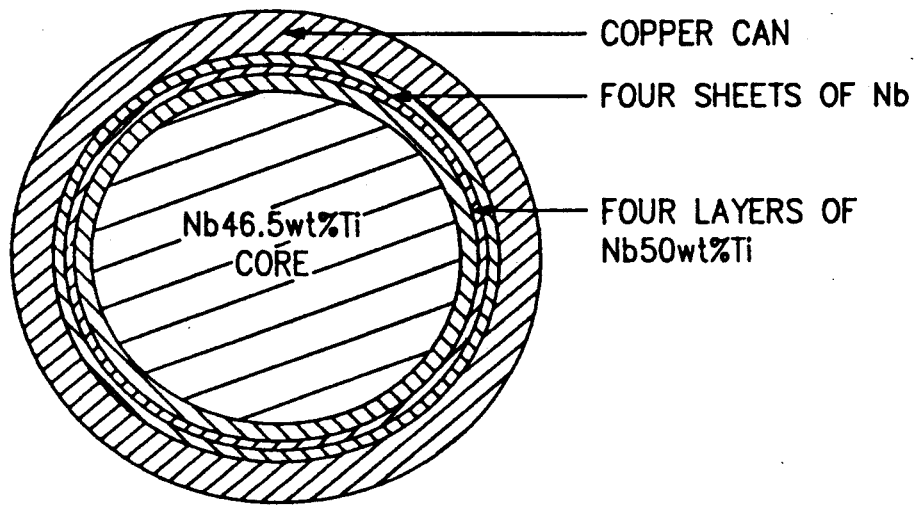

United States Patent [19]

Wong

[11] Patent Number: 5,182,176
[45] Date of Patent: Jan. 26, 1993

[54] EXTRUDED WIRES HAVING LAYERS OF SUPERCONDUCTING ALLOY AND REFRACTORY MEAL ENCASED IN A NORMAL METAL SHEATH

[75] Inventor: James Wong, Wayland, Mass.

[73] Assignee: Composite Materials Technology, Inc., Shrewsbury, Mass.

[21] Appl. No.: 605,926

[22] Filed: Oct. 30, 1990

Related U.S. Application Data

[63] Continuation-in-part of Ser. No. 525,124, May 17, 1990.

[51] Int. Cl.$^5$ .................... H01B 12/00; H01L 39/00
[52] U.S. Cl. .................... 428/930; 29/599; 148/98; 420/901
[58] Field of Search .................... 29/599; 148/11.5 Q, 148/11.5 F, 98; 428/930

[56] References Cited

U.S. PATENT DOCUMENTS

| | | | |
|---|---|---|---|
| 4,767,470 | 8/1988 | Tachikawa et al. | 29/599 |
| 4,803,310 | 2/1989 | Zeitlin et al. | 29/599 |
| 4,863,804 | 9/1989 | Whitlow et al. | 29/599 |
| 4,894,906 | 1/1990 | Huang | 29/599 |
| 4,959,279 | 9/1990 | Tanaka et al. | 29/599 |
| 4,973,365 | 11/1990 | Ozeryansky et al. | 148/11.5 F |
| 4,982,497 | 1/1991 | Mier | 29/599 |

OTHER PUBLICATIONS

A. Sourcebook of Ti-Alloy Superconductivity, E. W. Collins, Plenum, 1983, pp. 289-294.

*Primary Examiner*—Upendra Roy
*Attorney, Agent, or Firm*—Hayes, Soloway, Hennessey & Hage

[57] ABSTRACT

A Type II superconducting filament is formed by surrounding a Type II superconducting alloy ingot with layers of a fine grain Type II superconducting alloy sheet, a barrier layer and a copper extrusion can. The composite is then reduced to a filament by hot and cold working.

4 Claims, 2 Drawing Sheets

EXTRUDED WIRES HAVING LAYERS OF SUPERCONDUCTING ALLOY AND REFRACTORY MEAL ENCASED IN A NORMAL METAL SHEATH

This invention relates to the fabrication of improved fine filament superconducting wire. This application is in part a continuation of my copending application Ser. No. 07/525,124 filed May 17, 1990.

BACKGROUND OF THE INVENTION

In the production of high quality fine filament NbTi superconducting wire, manufacturers must rely heavily on the integrity of diffusion barriers. These barriers, usually Nb, are positioned between the copper cladding and the NbTi superconducting alloy that constitutes the bulk of a filament. The barrier serves to inhibit the formation of brittle CuTi intermetallics at the filament surface. Current processing schemes for the production of NbTi superconducting wire containing 4000-7000 filaments, each about 6 microns in diameter at the final wire size, utilize Nb barriers that constitute about 4% of the filament (non-copper) volume. The processing will typically subject the barrier to 500°-800° C. temperatures over a period of approximately 15 hours, followed by three or more 300°-450° C., 40-80 hour heat treatments as the wire is brought to final size. Current densities ($J_c$'s) in excess of 2750 A/mm$^2$ at 5 Tesla (T) and 1600 A/mm$^2$ at 7T (4.2° K.) can be achieved in fine filament conductors processed in this way (see, for example, "Superconducting Wire and Cable for the Superconducting Super Collider", T. S. Kreilick, E. Gregory, D. Christopherson, G. P. Swenson, and J. Wong, *Supercollider* 1, Plenum Press, 1989, 235-243).

While not unacceptable, these current densities are well below the 3800 A/mm$^2$ (5T, 4.2° K.) that has been achieved in wires with larger diameter filaments. The degradation in current density as the filaments grow finer is directly attributable to problems with the diffusion barrier.

The long periods at elevated temperatures during processing tend to undermine the Nb barrier due to Ti diffusion from the NbTi alloy core. It must be remembered that as Ti diffuses into the pure Nb barrier, Ti is depleted from the surface of the NbTi alloy filament core, resulting in lower overall $J_c$ in the core. The diffusion of Ti through the barrier also results in CuTi compound formation at the surface of the filament. This brittle CuTi compound fractures during cold reduction, resulting in "nodules" that adversely affect both the $J_c$ and the ductility of the wire. The surface interfaces between the copper matrix, the Nb barrier, and the NbTi core in a filament play a central role in this process.

In cases where irregular interfaces occur, extensive localized thinning of the diffusion barrier is observed. The effect is most pronounced in areas where there are projections into the barrier and even into the surrounding copper. It is believed that these areas are where CuTi compound will first form, and in greater quantity than in areas that do not display such thinning. These CuTi regions, the nodules, fracture during wire drawing and subsequently cause sausaging of the filaments. As a result, the wire displays severely degraded $J_c$ performance and is prone to breakage.

The obvious solution to the problem of diffusion barrier thinning is to simply use a thicker barrier, so that there are no thin spots to cause problems. Unfortunately, an increase in the barrier thickness comes only at the expense of the NbTi. The barrier supports no $J_c$ at operating magnetic fields, so thickening the barrier reduces the overall $J_c$. In addition, increasing the barrier thickness in no way remedies the problem of Ti depletion in the NbTi. While not so dramatic as the problem of CuTi compound formation, this problem cannot be ignored if current capacity is to be improved. So, while increased barrier thickness is an obvious solution to the problem of barrier thinning, it is far from ideal.

Rather than compensate for surface irregularities by thickening the barrier, we have found that it is better to eliminate those irregularities—i.e., to provide as uniform a surface behind the diffusion barrier as possible. When it is surrounded by a uniform surface, the diffusion barrier becomes more efficient. Nodule formation can be largely eliminated and, to the extent that any barrier might have to be thickened, the necessary increase can be minimized. The production of uniform NbTi surfaces in filaments is the primary objective of the invention.

Whenever two or more metals are co-processed, the degree of irregularity at their interface depends upon a great many factors. Among these are:
1. The relative hardness of the materials.
2. The grain size within the materials.
3. Texture and overall structure within the materials as dictated by prior metallurgical and mechanical processing (hot work, cold work, and total deformation, e.g.).

The ideal interface, from the standpoint of uniformity, is that between two metals of nearly equal hardness, both having very fine grains aligned along the plane of the interface so as to present the smoothest possible surfaces. Clearly, rolled sheet materials fit this description well. The use of rolled sheet for the purpose of increased filament uniformity forms the basis of the present invention. An earlier U.S. Pat. No. 4,646,197, issued to Supercon, Inc., related to the fabrication of Ta capacitor wire, wherein fine grained Ta sheet was wrapped around a Nb or Ta ingot to provide a smooth wire surface with marked resistance to Ta grain growth across the wire at elevated temperatures.

DESCRIPTION OF THE INVENTION

Figure 2:
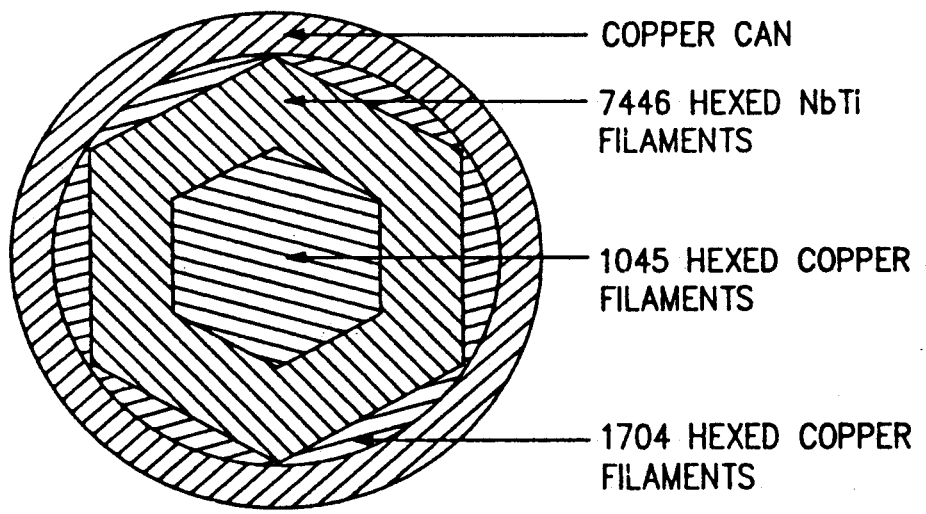

In order to more fully understand the invention, reference should be had to the following description and example taken in conjunction with the attached drawings wherein:

FIG. 1 shows the schematic design of a monofilament billet containing superconducting alloy sheets in accordance with the invention; and, FIG. 2 shows the schematic design of a multifilament billet that utilizes the monofilament fabricated in accordance with the invention.

In the production of fine filament superconducting wire, the current practice is to fabricate a monofilamentary wire from which multifilamentary wire is subsequently fabricated through the performance of one or more restacking operations. The monofilamentary wire is produced from a billet that generally consists of three elements: a superconducting alloy ingot, a barrier material which is in the form of sheet that is wrapped around the ingot, and a copper extrusion can that surrounds both the barrier and the ingot. In the present invention, a fourth element is added: a series of fine grained (ASTM micro-grain number>8) sheets of superconducting material situated between the barrier sheets and the ingot (see FIG. 1). These superconducting sheets reduce the degree of surface irregularity at the interface between the diffusion barrier and the ingot and are also believed to increase $J_c$ by virtue of the increased magnetic flux pinning afforded by both the finer grain structure in the sheets and the presence of sheet to sheet interfaces.

The superconducting alloy sheet may constitute all of the superconducting cross-sectional area or any portion thereof, the amount to be determined by the degree of uniformity required and the particular demands of the application. The sheet may be of any composition within the limitation that it is the same basic alloy as the central ingot. For example, if the ingot is Nb46.5wt%Ti, the NbTi sheet may have the composition Nb50wt%Ti. Again, this will be determined by the application.

The smooth sheet masks the minute irregularities of the ingot surface so that no localized thinning can occur in the diffusion barrier as a result of penetration by grains or by imperfections left over from the ingot fabrication. In addition, the ability to vary the sheet composition is a major advantage in light of diffusion losses. In the case of NbTi, the use of Ti rich sheets around the ingot will serve to compensate for diffusion losses so that the $J_c$ of the NbTi region will be maintained. The use of higher Ti concentrations (around 50% Ti by weight) in the sheet can also provide for improved $J_c$ performance. Ingots composed of these 50wt%Ti alloys are difficult to cold-work, but this problem does not arise if the superconducting area is properly divided between Ti rich sheet and a less rich ingot.

The practice of the present invention has shown an additional advantage to the use of NbTi sheet. In brief, the experiment that was performed involved the fabrication of two monofilament billets, one containing a standard ingot, the other containing NbTi sheets wrapped around a solid NbTi core. After processing, it was found that the wire containing the sheets displayed a higher current density as compared with the solid NbTi material. This was true regardless of wire size and throughout the 1–9T magnetic field range used in the $J_c$ tests. The $J_c$ in the sheet area was calculated based upon the known billet dimensions and was found to be 8–10% higher than in the solid NbTi. We therefore have reason to believe that the use of NbTi sheet can also increase the current density of a filament. Most likely this increase is due to an improvement in flux pinning caused by the interfaces between the sheets, but as yet that is not known with certainty.

The present invention clearly constitutes a major improvement on current barrier technology. Both the existing demand for high quality NbTi superconducting wire containing 6 micron filaments and the magnet industry's desire for wire having filaments as small as 2.5 micron is served by the application of the present invention. In particular, to produce the 2.5 micron material required (23,000 filaments) an additional restack is necessary. This additional processing step places even more pressure on the barriers than is imposed in the processing of 6 micron filament material. The present invention helps to maximize the effectiveness of barriers so that the most can be accomplished with the smallest amount of barrier material.

A preferred method of practicing the invention is set forth in the following non-limiting example.

EXAMPLE I

FIG. 1 is a schematic diagram of a NbTi monofilament billet cross section. The billet is typical for monofilament NbTi except that Nb50wt%Ti sheets have been included where solid NbTi ingot would ordinarily be. The Nb diffusion barrier and the NbTi sheets each occupy about 4% of the non-copper volume. The NbTi sheets have the composition Nb50wt%Ti in order to compensate for Ti depletion during the processing and to somewhat increase the $J_c$ in the final conductor. The sheet is fabricated from a Nb50wt%Ti ingot by rolling and annealing in such a way that the grain size in the 0.015" thick sheet is below a nominal diameter of about 22 microns (ASTM micro-grain size number > 8).

Three monofilament billets must be constructed in order to have enough material for the later multifilament billet.

All of the billets are constructed and processed in the same way. First, the NbTi ingots and the OFHC copper extrusion cans, noses, and tails are machined to the proper dimensions, and the Nb and NbTi sheets are cut to size. The standard monofilament design calls for a 24" long core, so the NbTi ingots must be cut to this length and all of the sheet material must be cut to this width. Based on the design in FIG. 1, each billet requires a 69.5" length of 0.015" thick Nb sheet and a 68.0" length of 0.015" thick Nb50wt%Ti sheet. Assembly is easier if these are continuous strips, but several shorter sections may be used if necessary. After all the components have been cleaned, the monofilament billets are assembled. Care must be taken to minimize the amount of void space in the sheet area. The NbTi ingots are inserted last. The copper nose and tail are then attached to the top and bottom of each billet by electron beam welding in vacuum.

The sealed billets are prepared for extrusion by heating them at 650° C. for 3 hours. The billets are then extruded at 650° C. from a 7.125" diameter liner to a diameter of 1.00". The extrusions are cropped to remove the excess copper at the noses and tails, and are then cold-drawn to restack size: hexagonal wire at a 0.1033" flat-to-flat.

FIG. 2 is a schematic diagram of the multifilament billet to be constructed from the hexed monofilament wire. While the monofilaments are actually hexagonal, in cross section they are shown as circles, for convenience. After a sufficient quantity of OFHC copper is drawn and hexed, both the copper and the NbTi monofilament wire are cut into 31.625" lengths. The can, nose, and tail are machined, all components are cleaned, and then the billet is assembled. The filaments are arranged symmetrically in the proportions indicated in FIG. 2, the intent being to minimize the void space that inevitably results when fitting an hexagonal, close packed array into a round can. When the filament array is complete, the copper can is slipped into position around it. More copper filaments are added to the perimeter of the array as necessary to ensure a tight fit. The nose and tail are then attached to the can by electron beam welding in vacuum.

The multifilament billet is HIP'd to consolidate the numerous subelements. As a result of the monofilament design, the HIP'd multifilament billet has a filament spacing-to-diameter ratio (s/d) of 0.168. Here, the diameter refers to the average NbTi filament diameter, including its barrier, and the spacing refers to the distance between adjacent filaments. A low s/d is important in preventing filament sausaging during extrusion; if the filaments are closely packed relative to their diameter, they provide mechanical support to one another. An s/d of 0.168 is adequate for a multifilament of this kind.

After the HIP, the nose and tail of the multifilament billet are machined to match the post HIP can diameter. Next, the billet is heated and then extruded from a 12.36" diameter liner to 3.25" in diameter. The extrusion is cropped and then drawn to the diameter at which the heat treatment schedule begins. The application of heat treatments separated by cold work serves to optimize the $J_c$ of the final conductor. The heat treatment schedule is open to informed modification, but the following is typical for a fine filament NbTi conductor: 375° C. for 40 hours at each wire diameter of 1.00", 0.640", 0.460", and 0.325".

After the last heat treatment, the multifilament is drawn to a final diameter of 0.0318", where the filament diameter is ~6 microns. Such a conductor is well suited to use in advanced machines like the Superconducting Super Collider. The application of the invention should significantly increase $J_c$ over the 2750 A/mm$^2$ (5T, 4.2° K.) typically obtained in comparable fine filament NbTi conductor. Piece length (the average length of the wire segments that reach final size) should also increase substantially due to the greater ductility of the nodule-free wire.

In accordance with the invention as described in Example I, the titanium losses can be offset by wrapping the NbTi ingot in the monofilament with NbTi sheets having a higher percentage of titanium than the ingot. However, this method requires that two alloys be melted, which is expensive. Furthermore, the higher titanium alloys are more difficult to cold-work than standard alloys, so the fabrication of high titanium sheet becomes a problem.

An alternative to the use of high titanium alloy sheets is to use sheets having the same composition as the ingot and to alternate these sheets with relatively thin layers of pure titanium. The thin titanium layers serve as a reservoir of titanium, diffusing into the alloy sheets even as those same sheets are losing titanium to the niobium barrier.

In general, the titanium sheets should be much thinner than the NbTi sheets so as to promote complete diffusion of the titanium. A NbTi to titanium sheet thickness ratio of 7:1 or greater is preferred. The overall volume of NbTi and titanium sheet should not exceed ~15% of the filament volume, since the titanium depletion will not be significant farther into the filament. Both the NbTi and titanium sheets should have a nominal grain diameter less than 22 μm (ASTM micro-grain number>8) in order to ensure maximum barrier efficiency. The outermost layer of titanium should be inside the outermost layer of NbTi. That is, the Nb barrier should not be in direct contact with titanium, since this situation only promotes titanium diffusion into the barrier.

Although the above discussion focuses on NbTi, it is obvious that these principles can be applied to any filamentary type II superconductor subject to analogous diffusion losses (NbZr losing Zr, e.g.). The same is true for the following non-limiting example, which sets forth a preferred method of practicing the invention:

EXAMPLE II

Figure 3:
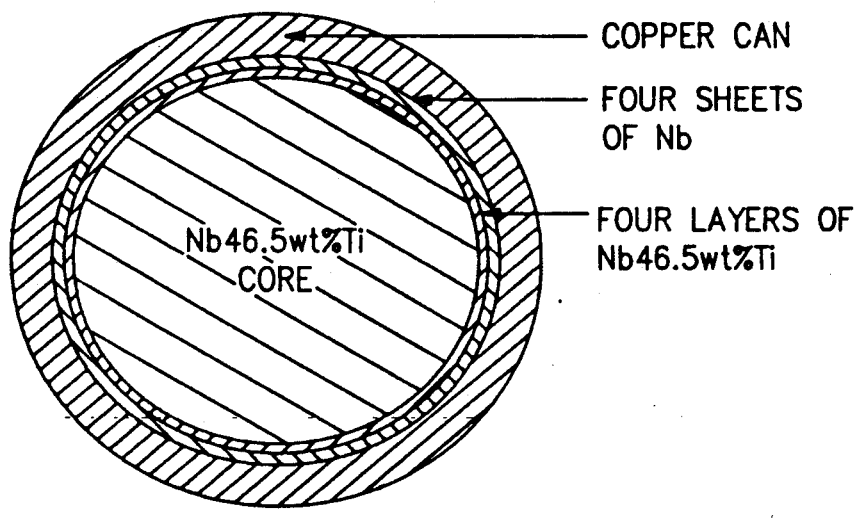

FIG. 3 is a schematic diagram of a NbTi monofilament billet cross section. The billet is typical for monofilament NbTi except that a series of Nb46.5wt%Ti and pure titanium sheets have been included where solid NbTi ingot would ordinarily be. The Nb diffusion barrier occupies about 4% of the non-copper volume, while the NbTi/titanium sheet volume is about 5%. Both the NbTi and the titanium sheets are fabricated from ingots by rolling and annealing in such a way that the nominal diameter of their grains is below about 22 μm (ASTM micro-grain number 8). The titanium sheet should be of Grade 2 purity or better for optimum workability.

Three monofilament billets must be constructed in order to have enough material for the later multifilament billet. All of the billets are constructed and processed in the same way. First, the NbTi ingots and the OFHC copper extrusion cans, noses, and tails are machined to the proper dimensions, and the niobium, NbTi, and titanium sheets are cut to size. The standard monofilament design calls for a 24" long core, so the NbTi ingots must be cut to this length and all of the sheet material must be cut to this width. Based on the design in FIG. 3, each billet requires a 72.0" length of 0.015" thick Nb sheet, a 68.0" length of 0.015" thick Nb46.5wt%Ti sheet, and a 68.0" length of 0.002" thick titanium sheet. Assembly is easier if these are continuous strips, but several shorter sections may be used if necessary.

After all the components have been cleaned, the monofilament billets are assembled. Care must be taken to minimize the amount of void space in the sheet area. The NbTi ingots are inserted after the sheet. The copper nose and tail are then attached to the top and bottom of each billet by electron beam welding in vacuum. The sealed billets are prepared for extrusion by heating them at 650° C. for 3 hours. The billets are then extruded at 650° C. from a 7.125" diameter liner to a diameter of 1.00". The extrusions are cropped to remove the excess copper at the noses and tails, and are then cold-drawn to restack size: hexagonal wire at a 0.1033" flat-to-flat.

The product is then treated as previously discussed in connection with FIG. 2. After a sufficient quantity of OFHC copper is drawn and hexed, both the copper and the NbTi monofilament wire are cut to 31.625" lengths. The can, nose, and tail are machined, all components are cleaned, and then the billet is assembled. The filaments are arranged symmetrically in the proportions indicated in FIG. 2, the intent being to minimize the void space that inevitably results when fitting an hexagonal, close packed array into a round can. When the filament array is complete, the copper can is slipped into position around it. More copper filaments are added to the perimeter of the array as necessary to ensure a tight fit. The nose and tail are then attached to the can by electron beam welding in vacuum.

The multifilament billet is HIP'd to consolidate the numerous subelements. As a result of the monofilament design, the HIP'd multifilament billet has a filament spacing-to-diameter ratio (s/d) of 0.168. Here, the diameter refers to the average NbTi filament diameter, including its barrier, and the spacing refers to the distance between adjacent filaments. A low s/d is important in preventing filament sausaging during extrusion; if the filaments are closely packed relative to their diameter, they provide mechanical support to one another. An s/d of 0.168 is adequate for a multifilament of this kind.

After the HIP, the nose and tail of the multifilament billet are machined to match the post-HIP can diameter. Next, the billet is heated and then extruded from a 12.36" diameter liner to 3.25" in diameter. The extrusion is cropped and then drawn to the diameter at which the heat treatment schedule begins. The application of heat treatments separated by cold work serves to optimize the $J_c$ of the final conductor. The heat treatment schedule is open to informed modification, but the following is typical for a fine filament NbTi conductor: 375° C. for 40 hours at wire diameters of 1.00", 0.640", 0.460", and 0.325".

After the last heat treatment, the multifilament wire is drawn to a final diameter of 0.0318", where the filament diameter is 6 μm. Such a conductor is well suited to use in advanced machines like the Superconducting Super Collider. The application of the Example II embodiment should significantly increase $J_c$ over the 2750 A/mm$^2$ (5T, 4.2° K.) typically obtained in comparable fine filament NbTi conductor. Piece length—the average length of the wire segments that reach final size—should also increase substantially due to the greater ductility of the nodule-free wire.

I claim:

1. A superconducting filament comprising a NbTi superconducting alloy core surrounded by at least two separate layers of NbTi alloy, a refractory metal barrier surrounding said layers and a normal metal sheath surrounding said barrier, said sheath, layers and core being metallurgically bonded by co-reduction of at least 10 times, the concentration of Ti in said separate layer being higher than in said core.

2. A superconducting filament comprising a NbTi superconducting alloy core surrounded by one or more separate layers of NbTi alloy, a refractory metal barrier surrounding said layers and normal metal sheath surrounding said barrier, said sheath, layers and core being metallurgically bonded by co-reduction of at least 10 times and a plurality of heat treatments in excess of 450° C. for a total time of at least 10 hours, said separate layers of NbTi having in the aggregate, a higher concentration of Ti than that of the NbTi core.

3. A superconducting filament comprising a NbTi superconducting alloy core surrounded by at least two separate layers of NbTi alloy, a refractory metal barrier surrounding said layers and a normal metal sheath surrounding said barrier, said sheath, layers and core being metallurgically bonded by co-reduction of at least 10 times, said separate layers of NbTi alloy having an initial grain size less than 22 microns nominal diameter (ASTM micro-grain size 8), said layers of fine grain NbTi sheet being interspersed with at least one layer of Ti.

4. The process of producing a NbTi superconducting alloy monofilament which comprises surrounding a NbTi superconducting alloy ingot with one or more layers of fine grain NbTi superconducting sheet and an outer refractory metal barrier layer, surrounding said barrier with a copper can, said fine grain layers having a grain size less then 22 microns in diameter, hot isostatically pressing said composite to bond said layers, hot extruding the resultant bonded product and reducing the extruded product to wire having a filament diameter less than 10 microns so that said NbTi layers are each less than 0.5 microns thick, said layers of fine grain NbTi sheet being interspersed with at least one layer of one of the metals Nb or Ti.

* * * * *